United States Patent [19]

Yamashita et al.

[11] Patent Number: 4,968,904
[45] Date of Patent: Nov. 6, 1990

[54] MESFET CIRCUIT WITH THRESHOLD-COMPENSATED SOURCE-FOLLOWER OUTPUT

[75] Inventors: Kiichi Yamashita, Kanagawa; Keiichi Kitamura; Nobuo Kotera, both of Kokubunji; Yasushi Hatta, Kodaira; Hiroyuki Tanaka, Fuchu, all of Japan

[73] Assignee: Hitachi, Ltd., Tokyo, Japan

[21] Appl. No.: 323,947

[22] Filed: Mar. 15, 1989

[30] Foreign Application Priority Data

Mar. 16, 1988 [JP] Japan .................................. 63-60385

[51] Int. Cl.⁵ .......................................... H03K 19/003
[52] U.S. Cl. ..................................... 307/475; 307/362; 307/443; 307/448; 307/450; 307/303.2
[58] Field of Search ............... 307/443, 446, 448, 450, 307/475, 367, 570, 303.2

[56] References Cited

U.S. PATENT DOCUMENTS

| 4,697,110 | 9/1987 | Masuda et al. ..................... 307/475 |
| 4,707,622 | 11/1987 | Takao et al. ..................... 307/475 X |
| 4,716,311 | 12/1987 | Davenport et al. ................. 307/448 |
| 4,728,821 | 3/1988 | Yang et al. .......................... 307/448 |
| 4,743,782 | 5/1988 | Nelson et al. ....................... 307/475 |
| 4,771,194 | 9/1988 | VanZeghbroeck ............. 307/450 X |
| 4,808,851 | 2/1989 | Chantepie ......................... 307/450 |
| 4,812,676 | 3/1989 | Yang et al. ..................... 307/448 X |
| 4,812,683 | 3/1989 | Fitzpatrick et al. ................. 307/448 |
| 4,831,284 | 5/1989 | Anderson et al. .................. 307/450 |

Primary Examiner—David Hudspeth
Attorney, Agent, or Firm—Antonelli, Terry, Stout & Kraus

[57] ABSTRACT

A logic circuit made up of FET's is disclosed in which an output interface circuit is formed of a source follower circuit including a signal transmitting FET and a constant-current supplying FET, and a ratio of the gate width of the signal transmitting FET to the gate width of the constant-current supplying FET is set so that the high and low levels of the output signal of the logic circuit are independent of the threshold voltage of the FET's.

3 Claims, 3 Drawing Sheets

MESFET CIRCUIT WITH THRESHOLD-COMPENSATED SOURCE-FOLLOWER OUTPUT

BACKGROUND OF THE INVENTION

The present invention relates to an FET logic circuit for processing a digital signal in a communication apparatus, a computer and others, and more particularly to an FET logic circuit which is suited to fabricate an integrated logic circuit using GaAs.MESFET device technology.

With the up-grading in the processing speed of a digital signal in a communication apparatus, a computer, a measuring instrument and others, it becomes necessary to realize a high-speed logic circuit. Thus, an ultra-high-speed integrated logic circuit has been earnestly developed which is formed of the so-called MES field effect transistors (namely, MESFET's) utilizing the Schottky barrier between a metal and a compound semiconductor such as GaAs, and some of such MESFET integrated logic circuits are now available on the market. However, it is difficult to replace an actually-used integrated logic circuit which is constituted of silicon bipolar transistors, by a GaAs MESFET integrated logic circuit, for the reasons that a field effect transistor is different in operation principle from a bipolar transistor and characteristics of the field effect transistor vary widely.

FIG. 2 shows the fundamental configuration of a conventional logic circuit including GaAs MESFET's (Technical Report of the Institute of Electronics and Communication Engineers of Japan, SSD86-46, pages 40 and 41). The logic circuit of FIG. 2 is usually called "source coupled logic". Referring to FIG. 2, the gate electrodes of FET's 11 and 12 are connected to a positive phase input terminal 3 and a negative phase input terminal 4, respectively, and the drain electrode of the FET 11 is connected to a ground terminal 1 through a diode 6. Further, the source electrodes of the FET's 11 and 12 are not only connected to each other, but also connected to a negative voltage terminal 2 through a resistor 6. A series combination of resistors 7 and 8 is connected in parallel to the diode 6, and the connecting point of the resistors 7 and 8 is connected to the drain electrode of the FET 12 through a resistor 9. The gate electrode of an FET 13 is connected to the drain electrode of the FET 12, and the source and drain electrodes of the FET 13 are connected to the ground terminal 1 and an output terminal 5, respectively. It is to be noted that the diode 6 and the resistors 7 to 9 are connected as shown in FIG. 2 to match the high level of the output signal of this logic circuit with the operating condition of the input/output interface circuit of a conventional emitter coupled logic. Now, let us express a voltage applied across the diode 6, the resistance values of the resistors 7 and 8, the threshold voltage of the FET 13, the mutual conductance factor of the FET 13 and an output current by $V_f$, $R_1$, $R_2$, $V_{th}$, $K_o$ and $I_{OH}$, respectively. Then, the high level $V_{OH}$ of the output voltage appearing on the terminal 5 is given by the following equation:

$$-V_{OH} = V_f \cdot \frac{R_1}{R_1 + R_2} + V_{th} + \sqrt{\frac{I_{OH}}{K_O}} \quad (1)$$

As is evident from the equation (1), the high level of the output voltage is a single-valued function of the threshold voltage $V_{th}$ of the FET 13. That is, the high level of the output voltage varies in proportion to a change in threshold voltage $V_{th}$. Variations in threshold voltage of a GaAs MESFET due to the manufacturing condition are so great that it is very difficult to replace an actually-used emitter coupled logic by a source coupled logic which includes GaAs.MESFETs.

SUMMARY OF THE INVENTION

It is accordingly an object of the present invention to provide an FET logic circuit which is not affected by variations in threshold voltage of an FET, to be usable in place of an emitter coupled logic, and which is suited to fabricate an integrated circuit.

In order to attain the above object, according to the present invention, there is provided an FET logic circuit, in which an output interface circuit is formed of a multi-stage source follower circuit, and a ratio of the gate width of a signal transmitting FET provided at each stage to the gate width of a constant-current supplying FET for supplying a constant current to the signal transmitting FET is set so that the level of the output signal of the FET logic circuit is independent of the threshold voltage of the FET's.

DESCRIPTION OF THE PREFERRED EMBODIMENTS

Figure 1:
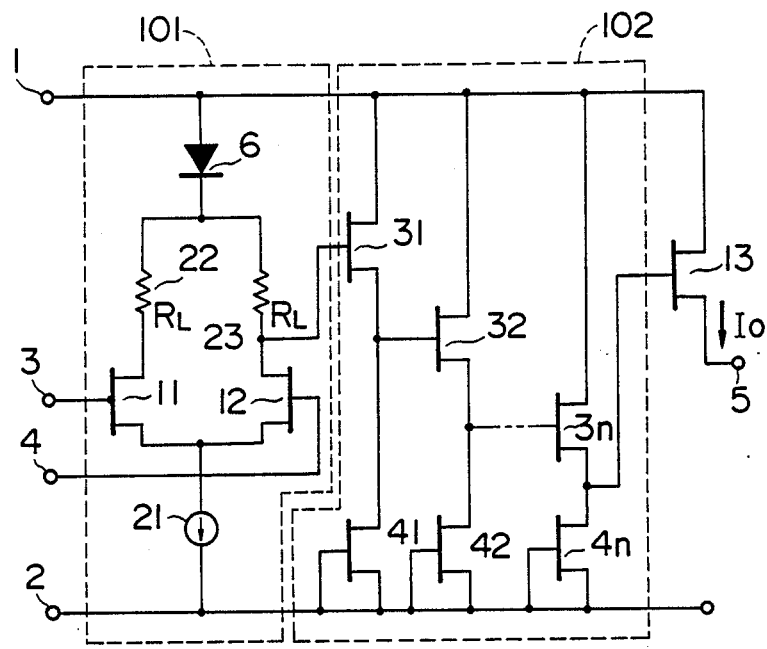
FIG. 1 is a circuit diagram showing an embodiment of an FET logic circuit according to the present invention.
Figure 2:
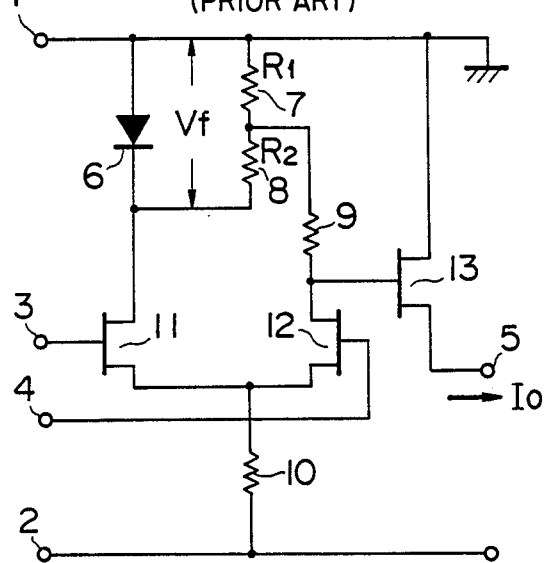
FIG. 2 is a circuit diagram showing typical one of conventional FET logic circuits.

FIG. 1 shows an embodiment of an FET logic circuit according to the present invention. Referring to FIG. 1, an output interface circuit 102 is formed of a multi-stage source follower circuit having n stages. In FIG. 1, reference numerals 31, 32 and 3n designate signal transmitting FET's, and 41, 42 and 4n constant-current supplying FET's. The FET's 31 and 41 make up a unit source follower circuit, and the FET's 32 and 42 make up another unit source follower circuit. Similarly, the FET's 3n and 4n make up a unit source follower circuit.

In a case where the level of a first signal applied to the terminal 3 is higher than the level of a second signal applied to the terminal 4, the FET 11 is made conductive. While, in a case where the level of the first signal is lower than the level of the second signal, the FET 11 is turned off, that is, the FET 11 is put in an OFF-state. The high level $V_{OH}$ and the low level $V_{OL}$ of an output voltage are given by the following made conductive. While, in a case where the level of the first signal is lower than the level of the second signal, the FET 11 is turned off, that is, the FET 11 is put in an OFF-state. The high level $V_{OH}$ and the low level $V_{OL}$ of an output voltage are given by the following equations:

$$V_{OH} = V_f - V_{th}\left(n + 1 - \sum_{n=1} \sqrt{K_{4n}/K_{3n}}\right) - \sqrt{\frac{I_{OH}}{K_O}} \qquad (2)$$

$$V_{OL} = V_f - V_{th}\left(n + 1 - \sum_{n=1} \sqrt{K_{4n}/K_{3n}}\right) - R_L I_S - \sqrt{\frac{I_{OL}}{K_O}}$$

where $K_{4n}$ and $K_{3n}$ indicate mutual conductance factors of the FET's $4n$ and $3n$, n the number of stages included in the multi-stage source follower circuit 102, R the resistance value of each of resistors 22 and 23, $I_S$ an output current from a constant current source 21, $I_{OH}$ and $I_{OL}$ output currents corresponding to the high level $V_{OH}$ and low level $V_{OL}$ of the output voltage, and $K_O$ the mutual conductance factor of an FET 13 for forming an output circuit.

As can be seen from the equations (2), the high level $V_{OH}$ and low level $V_{OL}$ of the output voltage are both independent of the threshold voltage $V_{th}$ of the FET's, provided that the number of stages included in the source follower circuit 102 and mutual conductance factors of the FET's 31 to $3n$ and 41 to $4n$ are so selected as to satisfy the following equation:

$$n + 1 = \sum_{n=1} \sqrt{K_{4n}/K_{3n}} \qquad (3)$$

The mutual conductance factor of an FET is proportional to the gate width thereof. Thus, the influence of variations in threshold voltage on the output voltage can be eliminated by selecting a ratio of the gate width $W_{g2n}$ of a constant-current supplying FET to the gate width $W_{g1n}$ of a signal transmitting FET so that the following equation is satisfied:

$$n + 1 \approx \sum_{n=1} \sqrt{W_{g2n}/W_{g1n}} \qquad (4)$$

Figure 3:
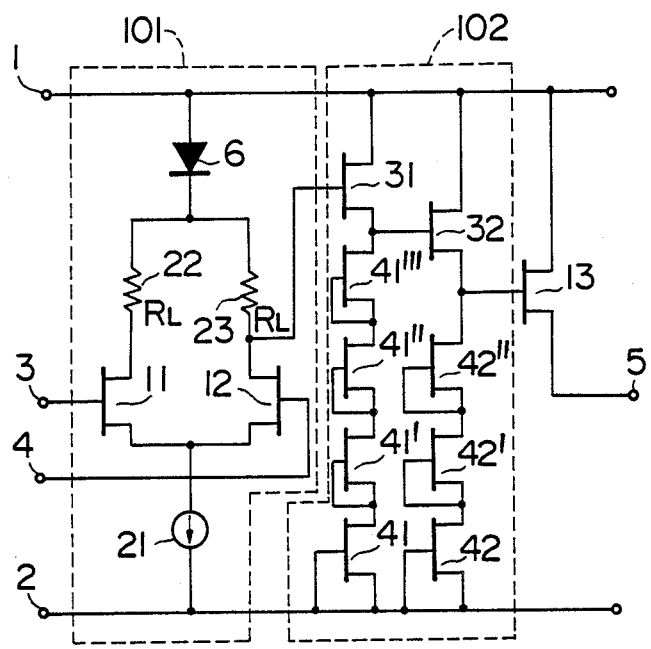
FIGS. 3, 4, 5A and 5B are circuit diagrams showing other embodiments of an FET logic circuit according to the present invention.

FIG. 3 shows another embodiment of an FET logic circuit according to the present invention. In the present embodiment, the source follower circuit 102 includes two stages, that is, the numeral n in the equation (3) is equal to two. The fundamental operation of the present embodiment will be explained below in detail. When the level of the first signal applied to the terminal 3 is "high" and the level of the second signal applied to the terminal 4 is "low", the whole of the current $I_S$ supplied from the constant current source 21 flows through the FET 11. Thus, the potential of the input terminal of the source follower circuit 102, that is, the potential of the gate electrode of the FET 31 is equal to the cathode potential $-V_f$ of the diode 6. When the level of the first signal is "low" and the level of the second signal is "high", the whole of the current $I_S$ from the constant current source 21 flows through the FET 12. Thus, the potential of the gate electrode of the FET 31 is equal to $(-V_f - R_L I_S)$. The potential of the gate electrode of the FET 31 is transmitted to the output terminal 5 through the FET's 31, 32 and 13. When the gate-source voltages of the FET's 31, 32 and 13 are expressed by $V_{g1}$, $V_{g2}$ and $V_{g3}$, respectively, the high and low levels of the output voltage are given by the following equations:

$$V_{OH} = -V_f - V_{g1} - V_{g2} - V_{g3H} \qquad (5)$$

$$V_{OL} = -V_f - R_L I_S - V_{g1} - V_{g2} - V_{g3L} \qquad (6)$$

where $V_{s3H}$ and $V_{s3L}$ indicate gate-source voltages of the FET 13 corresponding to the high and low levels of the output voltage. Further, the gate-source voltages $V_{g1}$, $V_{g2}$, $V_{g3H}$ and $V_{g3L}$ are given by the following equations:

$$\begin{aligned} V_{g1} &= \sqrt{I_1/K_{31}} + V_{th} \\ V_{g2} &= \sqrt{I_2/K_{32}} + V_{th} \\ V_{g3h} &= \sqrt{I_{OH}/K_O} + V_{th} \\ V_{g3L} &= \sqrt{I_{OL}/K_O} + V_{th} \end{aligned} \qquad (7)$$

where $I_1$ indicates a current flowing through the FET 31, and $I_2$ a current flowing through the FET 32. The currents $I_1$ and $I_2$ are supplied from the FET's 41 and 42, respectively, and hence are given by the following equations:

$$\begin{aligned} I_1 &= K_{41} V_{th2} \\ I_2 &= K_{42} V_{th2} \end{aligned} \qquad (8)$$

From equations (5) to (8), we can obtain the following equations:

$$V_{OH} = -V_f - \{3 - (\sqrt{K_{41}/K_{31}} + \sqrt{K_{42}/K_{32}})\}V_{th} - \sqrt{I_{OH}/K_O} \qquad (9)$$

$$V_{OL} = -V_f - R_L I_S - \{3 - (\sqrt{K_{41}/K_{31}} + \sqrt{K_{42}/K_{32}})\}V_{th} - \sqrt{I_{OL}/K_O}$$

As can be seen from the equations (9), the influence of variations in threshold voltage of the FET's on the output voltage can be eliminated by selecting ratios $K_{41}/K_{31}$ and $K_{42}/K_{32}$ so that the following equation is satisfied:

$$3 = \sqrt{K_{41}/K_{31}} + \sqrt{K_{42}/K_{32}} \qquad (10)$$

It is to be noted that the equation (10) is equal to the equation (3) for n=2.

Next, explanation will be made of an example of the actual design of the present embodiment. In this example, the ratio $K_{41}/K_{31}$ is made equal to the ratio $K_{42}/K_{32}$. In this case, from the equation (10), each of the ratios $K_{41}/K_{31}$ and $K_{42}/K_{41}$ is determined as follows:

$$K_{41}/K_{31} = K_{42}/K_{32} = 2.25 \quad (11)$$

The mutual conductance factors $K_{31}$, $K_{32}$, $K_{41}$ and $K_{42}$ are proportional to the gate width $W_{g31}$, $W_{g32}$, $W_{g41}$ and $W_{g42}$ of the FET's 31, 32, 41 and 42, respectively. Accordingly, the influence of variations in threshold voltage of the FET's on the output voltage can be eliminated by selecting the gate width $W_{g31}$, $W_{g32}$, $W_{g41}$ and $W_{g42}$ so that the following equation is satisfied:

$$W_{g41}/W_{g31} = W_{g42}/W_{g32} = 2.25 \quad (11)'$$

In an actual FET, however, owing to the short channel effect, a drain current varies with a change in source-drain voltage. Accordingly, even when the equation (11)' is satisfied, the output voltage is slightly changed by variations in threshold voltage. FET's 41', 41'', 41''', 42' and 42'' shown in FIG. 3 are provided to lessen the bad influence due to the short channel effect, and have no connection with the logical operation of the present embodiment. In more detail, when the FET's 41', 41'', 41''', 42' and 42'' are connected as shown in FIG. 3, the source-drain voltage of the FET 41 is reduced to about one-fifth the source-drain voltage of the FET 41 in a case where the FET's 41' to 42'' are absent, and the source-drain voltage of the FET 42 is reduced to about one-fourth the source-drain voltage of the FET 42 in the case where the FET's 41' to 42'' are absent. The reduction in the source-drain voltage of each of the FET's 41 and 42 makes variations in source-drain voltage small, and thus can suppress the bad influence due to the short channel effect. In the above, explanation has been made of the example, in which the ratio $K_{41}/K_{31}$ is made equal to the ratio $K_{42}/K_{32}$. However, the present embodiment is not limited to this example, but the ratio $K_{41}/K_{31}$ may be different from the ratio $K_{42}/K_{32}$ provided that the equation (10) is satisfied. Further, when an interface circuit having the same circuit configuration as the source follower circuit 102 is connected to the drain electrode of the FET 11 of the present embodiment, both of an OR output and a NOR output can be obtained.

Figure 4:
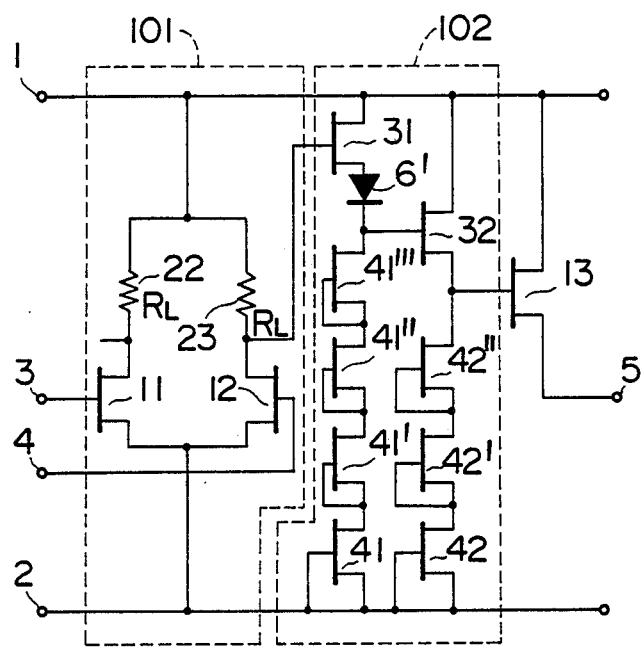

FIG. 4 shows a further embodiment of an FET logic circuit according to the present invention. In the present embodiment, the diode 6 of FIGS. 1 and 3 is omitted, and a diode 6' for shifting the potential level of the FET 31 or 32 is provided in the output interface circuit 102. The present embodiment can produce the same effect as obtained by the embodiments of FIGS. 1 and 3. The FET's 41', 41'', 41''', 42' and 42'' in the output interface circuit 102 may be replaced by diodes.

A logic gate (that is, fundamental logic circuit) gate 101 in FIGS. 1, 3 and 4 may be replaced by a flip-flop circuit. Further, it is not always required to form the logic gate 101 of an FET differential circuit, but the logic gate 101 may be formed of an FET inverter.

Figure 5A:
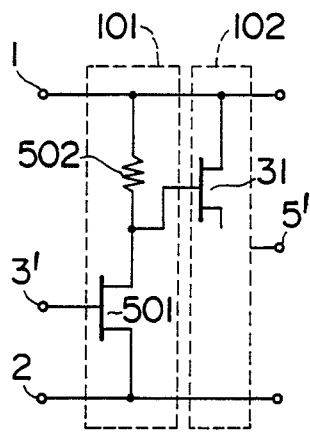
Figure 5B:
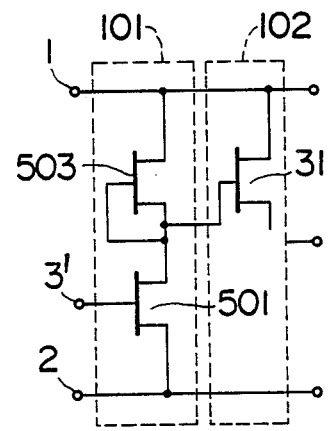

FIG. 5A shows still another embodiment of an FET logic circuit according to the present invention. In this embodiment, an FET inverter 501 is used for forming the logic gate 101, and a resistor 502 is used as the load of the inverter 502. FIG. 5B shows still a further embodiment of an FET logic circuit according to the present invention. In this embodiment, the FET inverter 501 is used for forming the logic gate 101, and an FET 503 is used as the load of the inverter 501. In the embodiments of FIGS. 5A and 5B, the level shifting diode 6 or 6' may be connected as shown in FIG. 3 or 4, and a resistor may be connected in parallel to the diode 6 or 6' so that a current flowing through the diode 6 or 6' is set to an appropriate value.

As has been explained in the foregoing, in an FET logic circuit according to the present invention, an output interface circuit is formed of a multi-stage source follower circuit, and a ratio of the gate width of a signal transmitting FET provided at each stage to the gate width of a constant-current supplying FET for supplying a constant current to the signal transmitting FET is set so that the output signal is independent of variations in threshold voltage of the FET's. Thus, the FET logic circuit can be used in place of an actually-used emitter coupled logic. Specifically, in a case where a logic circuit is formed of a GaAs MESFET, the circuit configuration and circuit condition according to the present invention are indispensable for the logic circuit, since the threshold voltage of the GaAs MESFET varies widely in accordance with the manufacturing condition thereof.

We claim:

1. An FET logic circuit including an FET, a diode and a resistor, comprising:
   a fundamental logic circuit;
   an output circuit; and
   an output interface circuit connected between the fundamental logic circuit and the output circuit, the output interface circuit being formed of a multi-stage source follower circuit, a ratio of the gate width $W_{g2n}$ of a constant-current supplying FET at the n-th stage of the multi-stage source follower circuit to the gate width $W_{g1n}$ of a signal transmitting FET at the n-th stage being set so as to satisfy the following equation:

$$n + 1 \approx \sum_{n=1} \sqrt{W_{g2n}/W_{g1n}}$$

2. An FET logic circuit according to claim 1, wherein a plurality of FET's are connected between the signal transmitting FET and the constant-current supplying FET.

3. An FET logic circuit according to claim 1, wherein a plurality of diodes are connected between the signal transmitting FET and the constant-current supplying FET.

* * * * *